United States Patent [19]

MacIver

[11] 4,410,611
[45] Oct. 18, 1983

[54] HARD AND ADHERENT LAYERS FROM ORGANIC RESIN COATINGS

[75] Inventor: Bernard A. MacIver, Lathrup Village, Mich.

[73] Assignee: General Motors Corporation, Detroit, Mich.

[21] Appl. No.: 462,302

[22] Filed: Jan. 31, 1983

Related U.S. Application Data

[60] Continuation of Ser. No. 297,916, Aug. 31, 1981, abandoned, which is a division of Ser. No. 144,579, Apr. 28, 1980, abandoned.

[51] Int. Cl.³ .......................... G03G 1/68; B05D 3/06
[52] U.S. Cl. .......................................... 430/5; 427/38; 428/142; 428/442; 430/291; 430/296; 430/319; 430/326
[58] Field of Search ................. 427/38; 428/142, 442; 430/5, 291, 296, 319, 326

[56] References Cited

U.S. PATENT DOCUMENTS

| | | | |
|---|---|---|---|
| 3,926,636 | 12/1975 | Barzynski et al. | 156/272 X |
| 3,989,524 | 11/1976 | Palac | 430/5 X |
| 4,018,937 | 4/1977 | Levine | 430/296 |
| 4,068,018 | 1/1978 | Hashimoto et al. | 430/5 |
| 4,078,098 | 3/1978 | Cortellino | 430/5 |
| 4,087,569 | 5/1978 | Hatzakis | 430/296 X |
| 4,211,834 | 7/1980 | Lapadula et al. | 430/5 X |
| 4,321,317 | 3/1982 | MacIver | 430/5 |

OTHER PUBLICATIONS

Okuyama et al., "High Dose Ion Implantation into Photoresist", *Journal of Electrochemical Society*, vol. 125, pp. 1293–1298, Aug. 1978.

Oldham, "The Fabrication of Microelectronic Circuits", *Scientific American*, vol. 237, No. 3, pp. 111–114, 119–124, 126, 128, Sep. 1977.

Leboss, "Deep UV Option Promotes Fine Lines", *Electronics*, Sep. 13, 1979, pp. 44, 46.

Fujimori et al., "The Effect of Ion Bombardment on Carbon Films Prepared by Laser Evaporation", *Japanese Journal of Applied Physics*, vol. 20, No. 3, pp. L194–L196, Mar. 1981.

Primary Examiner—James R. Hoffman
Attorney, Agent, or Firm—Robert J. Wallace

[57] ABSTRACT

A hard and adherent coating is formed from a sulfur-free organic resin coating by ion bombardment at an initial range, to at least partially carbonize the coating, and then at a lesser range, to enhance scratch resistance through improved adhesion.

12 Claims, No Drawings

HARD AND ADHERENT LAYERS FROM ORGANIC RESIN COATINGS

RELATED PATENT APPLICATIONS

This patent application is a continuation of my application Ser. No. 297,916, filed Aug. 31, 1981, which is a division of my application Ser. No. 144,579, filed Apr. 28, 1980, both now abandoned. This patent application is also related to my U.S. Pat. No. 4,321,317, filed Apr. 28, 1980.

FIELD OF THE INVENTION

This invention relates to photomasks used in the manufacture of integrated circuits. It more particularly relates to an improved photomask and photomask manufacturing process which provides increased dimensional accuracy and lower cost over photomasks conventionally made.

BACKGROUND OF THE INVENTION

Integrated circuit semiconductor devices are typically made using photoetching techniques in which a photoresist is exposed to a light source through a working photomask. The working photomask conventionally is a glass plate having a pattern of opaque areas photographically developed thereon. The working photomask is photographically formed by irradiating a photodarkenable emulsion through a master mask that has been made by photoetching techniques. The master photomask usually is made by photoetching a chromium layer on a glass substrate. In this latter instance, the photoresist does not need to contain grains of a material which will darken upon irradiation and development. Accordingly, where extremely high dimensional accuracy is desired, one may choose to use a chromium photomask as the actual working mask. However, since working masks tend to deteriorate with use, use of the chromium masks as working masks is quite expensive.

A recent report discloses using a normally transparent photoetching photoresist, such as Shipley's AZ-1350 and Tokyo Oka Kogyo's OMR-83 or OSR, as an opaque emulsion for a working mask. The report indicated that the photoresist was hardened by ion implantation and optically darkened enough to block out ultraviolet light above wave lengths of 300 nanometers. The hardening made the photoresist more scratch resistant. This type of film material does not require grains of photodarkening material to produce opacity. Film pattern resolution is therefore not limited by grain size, and dimensional accuracy is improved. In addition, the cost of making the photomask is reduced, due to process simplicity.

The aforementioned photoresist films have base polymers that are respectively cresol novolac resin, cyclized polyisoprene, and poly (-vinyloxethyl cinnamate). Such photoresists are sensitive to visible light and to near ultraviolet light. Upon exposure to such light, through a mask, a pattern is activated in the transparent resist. The exposed portions of the film are selectively washed away when the film is rinsed in an appropriate solvent. Patterned photoresist coatings of up to about 4000 angstroms were darkened and hardened by ion implantation at energies of about 20–180 keV at a rate of about 0.16–1.25 microamperes per square centimeter, in dosages of about $10^{14}$–$10^{16}$ ions per square centimeter.

I have now found that an electron sensitive resist on a quartz substrate can also be satisfactorily darkened to ultraviolet radiation and made scratch resistant by ion implantation. However, a thicker coating and a different ion implantation procedure is required. In this patent application I propose a two-stage ion implantation process that initially darkens and hardens the electron resist, and then makes it extremely adherent to its quartz substrate. Since the resist pattern is delineated by electron irradiation, an extremely high degree of dimensional accuracy is inherently available. My two-step ion implantation process does not significantly degrade it. Consequently, extremely narrow line widths, i.e. of the order of 0.5 micrometer and less, can be readily obtained. Master photomasks of high dimensional accuracy can be obtained, in a simple process. This at least provides master photomasks of lower cost, and may even provide master masks of higher quality. Such master photomasks can also be used as working photomasks, if desired. However, it is quite costly to generate the pattern in the resist by electron beam irradiation. Hence, use of an electron beam generated photomask as a working mask is not practical at this time.

On the other hand, it has recently been reported that the electron resists such as polymethyl methacrylate (PMMA) and polymethyl isopropenyl ketone (PMIK) can be satisfactorily activated by deep ultraviolet light sources, 220 nanometers and 253.3 nanometers in wave length, respectively. My two-stage ion implantation can be used on such resists, regardless as to whether they have been patterned by electron beam or ultraviolet radiation. Pattern definition by ultraviolet radiation cannot provide as fine a resolution as obtained by electron beam irradiation. However, it is a considerably quicker and less expensive process, and the resolutions attainable are more than adequate for most present integrated circuit designs. The deep ultraviolet radiation to which PMMA and PMIK are sensitive inherently provides almost twice the resolving power resolution as the near ultraviolet radiation now typically used for photoresists such as the aforementioned AZ-1350, OMR-83 or OSR. Hence, I intend to use my invention to also make working photomasks of PMMA, PMIK or the like. However, the patterns of the working masks would be generated by ultraviolet radiation, not by an electron beam. I have also found that if the resist is implanted as described herein, it will satisfactorily block ultraviolet light down to about 200 nanometers. Hence, an extremely fine resolution master photomask made in accordance with this invention can be used to make a very fine resolution working photomask made in accordance with this invention. Use of this invention in providing such an improved masking system is described more fully and claimed in the aforementioned U.S. Pat. No. 4,321,317.

OBJECTS AND SUMMARY OF THE INVENTION

It is, therefore, an object of this invention to provide unique high dimensional accuracy master and working photomasks.

Another object of the invention is to provide an improved method for making extremely high resolution master photomasks and very high resolution working photomasks.

The invention comprehends applying a layer about 0.5–1.0 micrometers thick of a transparent electron sensitive resist onto a transparent plate. The resist is then progressively exposed to an electron beam and developed in a conventional manner, to delineate a pattern of transparent resist on the plate. The resist is then given a two-stage ion implantation. In one example, the transparent resist is given a first implantation at an energy of 200 keV and a rate of 3 microamperes per square centimeter, to harden it and reduce its transmittency of ultraviolet light. It is then given a second ion implantation at an energy of about 100–150 keV at a rate of 3 microamperes per square centimeter to make the resist sufficiently scratch resistant. Both implantations are in dosages of $10^{15}$–$10^{16}$ ions per square centimeter.

Other objects, features and advantages of this invention will become more apparent from the following description of preferred examples thereof.

DESCRIPTION OF THE PREFERRED EMBODIMENTS

In making a photomask in accordance with this invention a transparent resist pattern is delineated on a quartz plate in the usual manner. For example, a film of electron resist is spun onto a flat, smooth glass substrate, and then baked to drive off excess solvent. The electron resist film is then selectively irradiated by a very small diameter electron beam that progressively scans the resist, under a computerized control. The resist coated plate is then immersed in an appropriate solvent that selectively dissolves the resist. In a positive electron resist, the resist portions which are irradiated by the electron beam are dissolved away. In a negative electron resist, the resist portions which are not irradiated by the electron beam are dissolved away. If the resist is one such as PMMA or PMIK, the pattern can be delineated by blanket exposure to deep ultraviolet light through a mask instead of by the computerized electron beam. In any event, a pattern of transparent resist is delineated on the quartz plate. The manner is not critical to this invention, and can be similar to that which one might use to delineate the resist for etching of a chromium film on a glass plate. However, in this invention no chromium film is needed and no etching of a chromium film is therefore required. Consequently, higher dimensional accuracies, simpler processing and higher mask quality are inherently obtainable.

After the electron resist has been delineated on the quartz plate, the entire surface of the plate on which the patterned resist resides is given a two-stage ion implantation. The first stage ion implantation makes the electron resist significantly less transparent to ultraviolet light, and hardens it. On the other hand, the bare quartz regions exposed to the ion implantation remain transparent and hard.

The same coated surface of the quartz plate is then given a second stage ion implantation, apparently to increase adhesion of the already hardened resist to its underlying quartz surface. In any event, scratch resistance is significantly improved. Optical density does not appear to change much. Scratch resistance is at least comparable to chrome photomasks, and approaches that of the underlying quartz itself.

The resultant resist is sufficiently optically dense for use in defining patterns in the aforementioned photoresists AZ-1350, OMR-83 and OSR, that are sensitive using near ultraviolet light. However, it is also dense enough for use in defining patterns in other electron resist coatings using deep ultraviolet light. Resolutions of the order of 0.1 micrometer are readily obtainable in my implanted resist, using presently available electron beam equipment for mask pattern generation. It is expected that improvements in electron beam equipment will permit even smaller resolutions to be obtainable. Since both electron beam lithography and ion implantation are now conventional manufacturing techniques in the semiconductor industry, my photomasks are relatively easy to fabricate.

In a specific example of this invention a 0.8 micrometer thick coating of polymethyl methacrylate (PMMA) positive-type electron resist was applied to a 15 mm thick, flat, clear and colorless quartz plate in the usual manner. The liquid resist was applied to the plate and the plate spun to get a uniform thin coating. The coated plate was then baked in air at 80° C. for 30 minutes. Selected regions of the resist were then progressively exposed by selective irradiation with a 10 keV electron beam in a dosage of about $10^{-6}$ C per square centimeter. The beam source was such as used in a scanning electron microscope and had an electron beam mean diameter of about 0.1 μm. The exposed resist was then developed by immersion of the irradiated coated plate in methyl-isobutyl-ketone for about 2 minutes at room temperature. The methyl-isobutyl-ketone was manually agitated during this immersion. The portions of the electron resist exposed to the electron beam were dissolved away, leaving a pattern of transparent electron resist on the quartz plate.

The quartz plate having the thus formed resist pattern on it was then given a uniform ion implantation across its entire surface, using $^{28}Si^+$ at an energy of approximately 200 keV and a flux of 3 microamperes per square centimeter in a dosage of $5 \times 10^{15}$ silicon ions per square centimeter. It darkened somewhat and exhibited a transmittancy of about 1.5% and 1% with respect to near and deep ultraviolet light of a wavelength of 400 nm and 220 nm, respectively. This implantation caused the electron resist to shrink in thickness from the original 0.8 micrometer to about 0.16 micrometer. However, only a thickness shrinkage was observed. No significant lateral shrinkage was noticed. Accordingly, the high dimensional accuracy attributable to the electron beam pattern generation was preserved. However, the resist was not scratch resistant.

The entire aforementioned surface of the quartz plate, including the resist, was then given a second uniform implantation with $^{28}Si^+$. However, this time the implantation energy was 100 keV at a flux of 3 micrometers per square centimeter in a dosage of $5 \times 10^{15}$ silicon ions per square centimeter. The resist shrank in thickness only slightly, if at all. Thus, dimensional accuracy was still preserved. However, the resist became highly scratch resistant. It appears to be at least comparable to that of chromium and approaches the scratch resistance of the underlying quartz itself. Transmittancy, however, remained about the same as after the first implantation.

Electron sensitive resists such as PMMA and PMIK do not lose as much transmittancy due to ion implantation as do other photoresists. Accordingly, it seems necessary to start with thicker coatings of about 0.5–1.0 micrometers. Lesser thicknesses do not provide sufficient optical density. However, once sufficient density is acquired, it is effective on wave lengths as low as about 200 nanometers. Higher thicknesses apparently require implantation energies beyond the capability of ion implantation equipment ordinarily available. I believe that if the entire thickness of the resist is not exposed to the implanted ions, the entire thickness will not harden. It not hardened throughout, an initial requirement for scratch resistance is not realized.

Implantation energies of at least about 180 keV are apparently necessary to provide complete penetration of the photoresist. 200 keV is the maximum energy available on the equipment I used. However, I believe that higher implantation energies would be useful in this invention. On the other hand, high implantation energies alone are not sufficient to darken the electron resist. The implantation must also be conducted at a rate, i.e. flux, of at least about 2 microamperes per square centimeter and preferably higher. I prefer, and have mostly used, 3 microamperes per square centimeter. While 3 microamperes per square centimeter is the highest rate my equipment will provide, I expect that higher implantation rates will be at least equally satisfactory.

Implantation must not only be at high energies and fluxes but also at dosages of at least about $1 \times 10^{15}$ ions per square centimeter. Otherwise, sufficient optical density for effective masking does not obtain. Dosages in excess of about $5 \times 10^{16}$ ions per square centimeter are to be avoided because they are time consuming and costly and do not provide further benefits. Optical density may even decrease.

I expect that this invention is not dependent on any particular ion species to produce its effect. The prior one-step ion implantation process for darkening and hardening the resist disclosed that each ion species of $^{31}P+$, $^{40}Ar+$, $^{11}B+$ and $^{49}BF_2+$ would work. As noted above, I prefer to use $^{28}Si+$. There is obviously a change that occurs in the electron resist by the first implantation of this invention. Presumably, graphitization occurs through decomposition of the resist by energy imparted by the ion bombardment. As previously indicated, the electron resist shrinks in thickness to about ¼ or less of its original thickness. I believe that this change in thickness permits the implanted ions to penetrate too deeply through the resist into the underlying quartz substrate. I further believe that this deep penetration of the ion species does not permit the densified resist to adequately adhere to the quartz surface.

In any event, I have found that if the original densifying and hardening implant is followed with a lower energy implant of about 100–150 keV, a considerably higher degree of scratch resistance is obtained. Above and below the range of 100–150 keV, the resultant resist has a lesser scratch resistance. I do not believe the second implant produces significant hardening of the resist coating itself. I believe that the resist is hardened by the first implant but the hardened resist does not adhere well to the quartz. The added scratch resistance is thus attained because the second implant lodges ions at or near the resist-quartz interface. This activates the interface, and bonds the densified film to the underlying quartz substrate.

Implant energies of about 100–150 keV alone are not enough to achieve the additional scratch resistance. The implantation must be at a rate of at least 2 microamperes per square centimeter and preferably 3 microamperes per square centimeter. As mentioned in connection with the first implantation, it may be desirable to use implantation rates above 3 microamperes per square centimeter, but this is the limit of the equipment which I used. Analogous to the first implantation, dosages should be about $10^{15}$–$10^{16}$ ions per square centimeter. Dosages of less than $1 \times 10^{15}$ ions per square centimeter are unsatisfactory because the required adhesion is not obtained. Dosages more than about $5 \times 10^{16}$ ions per square centimeter are unsatisfactory because optical density decreases above $5 \times 10^{16}$ ions per square centimeter.

While I have described this invention only in connection with the electron resist polymethyl methacrylate, I believe that it is equally applicable to other electron resists such as polymethyl isopropenyl ketone. I further believe that this invention is applicable to any other electron or photoresist which does not exhibit adequate darkening at a low enough wave length, or adequate scratch resistance, from the previously known one-step stage implantation process. In such instance, an initial implant would be given at a higher energy to obtain optimum optical density and a second implant be given at a lower energy to obtain optimum scratch resistance.

Accordingly, this invention can be used to form masks of any sort, with any resist. However, in its preferred form, it appears to be most advantageously used to form an electron beam delineated master working mask which in turn is used to form an ultraviolet light delineated working photomask. Both the master photomask and the working photomask can thus be made of polymethyl methacrylate patterned resist on a quartz substrate hardened in accordance with this invention. Such masks can even be used to delineate a pattern of electron resist on a silicon slice for high resolution etching purposes, as is more fully described and claimed in my aforementioned U.S. Pat. No. 4,321,317.

In the foregoing description of this invention I describe using a quartz plate as a transplant substrate for the resist, instead of a glass plate. The glass in plates ordinarily used for current integrated circuit masks will transmit near ultraviolet light adequately but not deep ultraviolet light. Quartz is sufficiently transparent to deep ultraviolet light to provide a practical substrate. Accordingly, I prefer to use quartz substrates. On the other hand, if deep ultraviolet light is not to be used, or if a glass is available that is sufficiently transparent to deep ultraviolet light, it may be desirable to use glass as a substrate instead of quartz. Glass may even be preferred as a substrate, because of its lower cost, when one wants to use my process to merely impart enhanced darkening and/or scratch resistance over the known single stage ion implantation process, for resist masks used with near ultraviolet light.

The embodiments of the invention in which an exclusive property or privilege is claimed are defined as follows:

1. A method of making a hard and adherent coating, comprising the steps of:
    applying to a substrate a coating of a sulfur-free organic resin that shrinks in thickness when subjected to ion bombardment, the coating having an implantation surface and providing a coating-substrate interface,
    implanting ions into the implantation surface, at a first energy that provides complete penetration of the resin coating at the beginning of bombardment, for a duration long enough to at least partially carbonize the coating, and
    subsequently implanting ions into the implantation surface, at at least one lesser energy that lodges the ions at or near the coating-substrate interface, for a duration that enhances hardness and scratch resistance of the coating over that obtained by the first-mentioned ion implantation.

2. A method of making an adherent, hard and scratch-resistant coating comprising the steps of:

applying a coating of a sulfur-free organic resin that shrinks in thickness when subjected to ion implantation to a surface of a chemically compatible substrate, first implanting ions into the coated surface, at an energy that allows the ions to penetrate through the entire coating thickness into the substrate, for a duration long enough to measurably reduce thickness of the resin coating, and then implanting ions into the coated surface, at at least one lesser energy that allows the ions to lodge at or near the substrate surface, effective to provide an adherent, hard and abrasion-resistant coating on the substrate surface.

3. A method of making a scratch-resistant coating on a substrate surface comprising the steps of:

applying onto a substrate a coating at least about 0.5 micrometer thick of a sulfur-free organic resin of the methacrylate type, which yields free carbon and significantly shrinks in thickness when subjected to ion implantation, the coating and substrate having an interface, at least partially decomposing the coating into a carbon film by an initial ion implantation at a first energy that is at least generally targeted to provide ion penetration below the interface, and thereafter bonding the film to the substrate, effective to increase its scratch resistance, by implanting ions into the film at a less than initially used energy that is targeted to lodge the ions at or near the interface.

4. The product produced by the process as defined in claim 1.

5. A method of making a photomask for use in replicating integrated circuit patterns in a photoresist coating, comprising the steps of:

applying a coating of resist onto a substrate transparent to ultraviolet light, delineating an integrated circuit pattern of resist on the substrate, darkening the patterned resist by ion implantation at a high energy preselected to provide high optical density with respect to a preselected wavelength of radiation, and giving the patterned resist a second ion implantation at a lesser energy that is preselected to provide high scratch resistance for the resist without significantly reducing its optical density.

6. A method of making a photomask for use in replicating integrated circuit patterns in a photoresist coating, comprising the steps of:

forming an integrated circuit pattern of an electron sensitive resist, at least about 0.5 micrometer thick, onto a substrate substantially transparent to deep ultraviolet light, darkening the patterned resist by ion implantation at an energy greater than about 180 keV at a rate greater than about 2 microamperes per square centimeter and at a dosage of about $10^{15}$–$10^{16}$ ions per square centimeter, and enhancing scratch resistance of the darkened patterned resist by a second ion implantation at an energy of about 100–150 keV at a rate of at least about 2 microamperes per square centimeter at a dosage of about $10^{15}$–$10^{16}$ ions per square centimeter.

7. A method of making a photomask suitable for delineating patterns in photoresists sensitive to ultraviolet light as low as 220 nanometers comprising the steps of:

applying a 0.5–1.0 micrometer thick coating of a polymethyl methacrylate resist onto a quartz substrate, delineating a transparent integrated circuit pattern of resist on the substrate, implanting the patterned resist with ions at an energy in excess of about 180 keV at a rate greater than about 2 microamperes per square centimeter in a dose of about $10^{15}$–$10^{16}$ ions per square centimeter to reduce the thickness of the photoresist to about ¼ of its original thickness and substantially inhibit transmittance of ultraviolet light having a wavelength shorter than about 300 nanometers, and thereafter subjecting the patterned resist to a lower energy implantation of about 100–150 keV at a rate of more than about 2 microamperes per square centimeter and at a dosage of about $10^{15}$–$10^{16}$ ions per square centimeter to increase resist scratch resistance on the quartz plate.

8. The product produced by the process as defined in claim 7.

9. A method of making a photomask for use in replicating integrated circuit patterns in a resist coating, comprising the steps of:

applying a film of resist onto a substrate transparent to ultraviolet light, so as to provide a film-substrate interface, delineating an integrated circuit pattern of the resist on the substrate, implanting ions into the patterned film at an energy preselected to carbonize the film substantially throughout its thickness, and thereafter implanting additional ions into the film at a lesser energy that is preselected to enhance film scratch resistance.

10. The product produced by the process as defined in claim 9.

11. A method of making a photomask for use in replicating integrated circuit patterns in a resist coating, comprising the steps of:

applying a film of resist onto a transparent substrate, so as to provide a film-substrate interface, delineating an integrated circuit pattern of the resist on the substrate, implanting the resist film with ions at an energy and in a dose preselected to more than merely carbonize the patterned resist film, wherein the total dosage is preselected to obtain an intended compromise between film hardness and film transparency and a significant proportion of the implanted ions are of an energy targeted for the film-substrate interface to obtain increased adhesion of the film to the substrate, effective to produce a patterned photomask of enhanced wear resistance.

12. A method of making a photomask for use in replicating integrated circuit patterns in a resist coating, comprising the steps of:

forming a film at least about 0.5 micron thick of a methacrylate-type resist on a substrate substantially transparent to deep ultraviolet light, said film and substrate having an interface, initially implanting the resist with ions at an energy and dosage sufficient to carbonize the film substantially throughout its thickness and increase its optical density with respect to deep ultraviolet light, and then enhancing scratch resistance of the initially implanted resist by additional implantation of ions at an energy targeted substantially for the resist-substrate interface, the additional implantation being at a dosage which when combined with the initial implantation dosage is less than that which will significantly reduce the film optical density.

* * * * *